(12) United States Patent
Jeon et al.

(10) Patent No.: US 9,245,738 B2
(45) Date of Patent: Jan. 26, 2016

(54) HIGH ELECTRON MOBILITY TRANSISTOR AND METHOD OF MANUFACTURING THE SAME

(71) Applicant: Samsung Electronics Co., Ltd., Suwon-Si, Gyeonggi-Do (KR)

(72) Inventors: Woo-chul Jeon, Daegu (KR); Jong-seob Kim, Seoul (KR); Ki-yeol Park, Suwon-si (KR); Young-hwan Park, Seoul (KR); Jai-kwang Shin, Anyang-si (KR); Jae-joon Oh, Seongnam-si (KR); Hyuk-soon Choi, Hwaseong-si (KR); In-jun Hwang, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/091,822

(22) Filed: Nov. 27, 2013

(65) Prior Publication Data
US 2014/0151749 A1 Jun. 5, 2014

(30) Foreign Application Priority Data

Nov. 30, 2012 (KR) ........................ 10-2012-0138512

(51) Int. Cl.
*H01L 21/02* (2006.01)
*H01L 29/66* (2006.01)
*H01L 29/778* (2006.01)
(Continued)

(52) U.S. Cl.
CPC .... *H01L 21/02109* (2013.01); *H01L 29/66462* (2013.01); *H01L 29/7786* (2013.01); *H01L 29/0619* (2013.01); *H01L 29/1066* (2013.01);
(Continued)

(58) Field of Classification Search
CPC ............. H01L 29/778; H01L 29/7781; H01L 29/7786; H01L 29/7787; H01L 29/7832; H01L 29/2003; H01L 29/42316; H01L 29/402; H01L 29/0605; H01L 29/0619; H01L 29/66462; H01L 29/4236; H01L 29/66886; H01L 29/8124; H01L 29/8128
USPC .......... 257/194, E29.246, E29.127, 192, 195, 257/E21.172, E21.403, E21.407, E29.253; 438/172

See application file for complete search history.

(56) References Cited

U.S. PATENT DOCUMENTS 6,785,151 B2 8/2004 Ingman et al.
7,498,617 B2 3/2009 Kinzer
(Continued)

FOREIGN PATENT DOCUMENTS

JP  2006020405 A  1/2006
JP  2006344779 A  12/2006
(Continued)

*Primary Examiner* — Lynne Gurley
*Assistant Examiner* — Tong-Ho Kim
(74) *Attorney, Agent, or Firm* — Harness, Dickey & Pierce, P.L.C.

(57) ABSTRACT

According to example embodiments, a high electron mobility transistor (HEMT) includes a channel layer; a channel supply layer on the channel layer; a source electrode and a drain electrode spaced apart from each other on one of the channel layer and the channel supply layer; a gate electrode on a part of the channel supply layer between the source electrode and the drain electrode; a first depletion-forming layer between the gate electrode and the channel supply layer; and a at least one second depletion-forming layer on the channel supply layer between the gate electrode and the drain electrode. The at least one second depletion-forming layer is electrically connected to the source electrode.

16 Claims, 6 Drawing Sheets

(51) Int. Cl.
  *H01L 29/861* (2006.01)
  *H01L 29/06* (2006.01)
  *H01L 29/10* (2006.01)
  *H01L 29/20* (2006.01)

(52) U.S. Cl.
  CPC ......... *H01L 29/2003* (2013.01); *H01L 29/8613* (2013.01)

(56) References Cited

U.S. PATENT DOCUMENTS

| | | | |
|---|---|---|---|
| 7,759,760 | B2 | 7/2010 | Yafune et al. |
| 8,154,073 | B2 | 4/2012 | Aoki et al. |
| 2007/0102727 | A1 | 5/2007 | Twynam |
| 2010/0155781 | A1* | 6/2010 | Suzuki et al. ............... 257/195 |
| 2012/0056242 | A1 | 3/2012 | Tsuzuki et al. |
| 2013/0062666 | A1* | 3/2013 | Imada ........................ 257/194 |
| 2013/0082336 | A1* | 4/2013 | Imada ........................ 257/409 |
| 2013/0292699 | A1* | 11/2013 | Ueno et al. .................. 257/76 |

FOREIGN PATENT DOCUMENTS

| | | | |
|---|---|---|---|
| JP | 2007215389 A | | 8/2007 |
| JP | 2011-096618 | * | 4/2011 |
| JP | 2011-199657 | * | 9/2011 |
| JP | 2011-214722 | * | 9/2011 |
| KR | 20080035942 A | | 4/2008 |
| KR | 20080038004 A | | 5/2008 |
| KR | 20110020294 A | | 3/2011 |

* cited by examiner

HIGH ELECTRON MOBILITY TRANSISTOR AND METHOD OF MANUFACTURING THE SAME

CROSS-REFERENCE TO RELATED APPLICATIONS

This application claims priority under 35 U.S.C. §119 to Korean Patent Application No. 10-2012-0138512, filed on Nov. 30, 2012, in the Korean Intellectual Property Office, the disclosure of which is incorporated herein in its entirety by reference.

BACKGROUND

1. Field

Example embodiments relate to a high electron mobility transistor and/or a method of manufacturing the same, and more particularly, to a high electron mobility transistor capable of passing a current in a forward direction and a reverse direction and/or a method of manufacturing the same.

2. Description of Related Art

In a power transformation system, the system efficiency may depend on the efficiency of a semiconductor switching device. In most cases, a power metal oxide semiconductor field effect transistor (MOSFET) or an insulated gate bipolar transistor (IGBT) has been used as a switching device, but increasing the efficiency of the switching device may be limited due to the materials used in such transistors, such as silicon.

Research for developing a high electron mobility transistor (HEMT) has been conducted. A HEMT may include semiconductor layers having different electric polarization characteristics. A semiconductor layer having a relatively high polarizability in the HEMT may induce a two-dimensional electron gas (2DEG) to move to another semiconductor layer heterojunctioned thereto. The 2DEG may be used as a channel between a drain electrode and a source electrode, and a current flowing through this channel may be controlled by applying a bias voltage to a gate electrode.

In a field effect semiconductor switching device, such as a HEMT, a potential of a drain electrode may become lower than a potential of a source electrode. In such a case, a reverse voltage may be applied to the field effect semiconductor switching device. To reduce (and/or prevent) this, a free wheeling diode may be connected in parallel to the field effect semiconductor switching device. However, in this situation, an additional process for manufacturing a separate free wheeling diode is necessary, and accordingly, the size of the field effect semiconductor switching device increases. Additionally, the manufacturing costs also increase.

SUMMARY

Example embodiments relate to a single high electron mobility transistor (HEMT) configured to function both as a field effect semiconductor device and a free wheeling diode.

Example embodiments also relate to a method of manufacturing a HEMT configured to function both as a field effect semiconductor device and a free wheeling diode.

Additional aspects will be set forth in part in the description that follows and, in part, will be apparent from the description, or may be learned by practice of example embodiments.

According to example embodiments, a high electron mobility transistor (HEMT) includes: a channel layer; a channel supply layer on the channel layer; a source electrode and a drain electrode spaced apart from each other on one of the channel layer and the channel supply layer; a gate electrode on a part of the channel supply layer between the source electrode and the drain electrode; a first depletion-forming layer between the gate electrode and the channel supply layer; and at least one second depletion-forming layer on the channel supply layer between the gate electrode and the drain electrode, the at least one second depletion-forming layer being electrically connected to the source electrode.

In example embodiments, a thickness of the at least one second depletion-forming layer may be less than a thickness of the first depletion-forming layer.

In example embodiments, the thickness of the second depletion-forming layer may be about 20% to about 30% of the thickness of the first depletion-forming layer.

In example embodiments, the channel layer may include a 2DEG, and the second depletion-forming layer may have a thickness so that a density of a two-dimensional electron gas (2DEG) below the second depletion-forming layer has about 90% or more of a density of a 2DEG formed in an adjacent region.

In example embodiments, the at least one second depletion forming layer may include a plurality of second depletion-forming layers, and the plurality of second depletion-forming layers may be spaced apart from each other along a width direction of a channel in the channel layer.

In example embodiments, the plurality of second depletion-forming layers may have a stripe pattern that is parallel with the width direction of the channel formed in the channel layer.

In example embodiments, the at least one second depletion-forming layer may be one continuous second depletion-forming layer that extends along a width direction of a channel in the channel layer.

In example embodiments, the at least one second depletion-forming layer may be a plurality of second depletion-forming layers spaced apart from each other along a width direction of a channel in the channel layer.

In example embodiments, each of the first and the at least one second depletion-forming layers may include a p-type semiconductor layer.

In example embodiments, the HEMT may further include: a first pad contacting the source electrode and the at least one second depletion-forming layer; and a second pad contacting the drain electrode.

In example embodiments, a passivation layer may be between the gate electrode and the first pad.

According to example embodiments, a method of manufacturing a high electron mobility transistor (HEMT) includes: forming a channel layer; forming a channel supply layer on the channel layer; forming a first depletion-forming layer and at least one second depletion-forming layer on the channel supply layer; forming a source electrode and a drain electrode spaced apart from each other on one of the channel layer and the channel supply layer; and forming a gate electrode on the first depletion-forming layer.

In example embodiments, a thickness of the at least one second depletion-forming layer may be less than a thickness of the first depletion-forming layer, and the at least one second depletion-forming layer may be between the first depletion-forming layer and the drain electrode.

In example embodiments, the forming the at least one second depletion-forming layer may include forming a plurality of second depletion-forming layers, and the plurality of second depletion-forming layers may be spaced apart from each other along a width direction of a channel in the channel layer.

The second depletion-forming layer may be continuously formed along the width direction of the channel formed in the channel layer.

In example embodiments, the method may further include: forming a first pad contacting the source electrode and the at least one second depletion-forming layer; and forming a second pad contacting the drain electrode.

In example embodiments, the method may further include forming a passivation layer between the gate electrode and the first pad.

BRIEF DESCRIPTION OF THE DRAWINGS

These and/or other aspects will become apparent and more readily appreciated from the following description of non-limiting embodiments, taken in conjunction with the accompanying drawings in which like reference characters refer to like parts throughout the different views. The drawings are not necessarily to scale, emphasis instead being placed upon illustrating features of example embodiments. In the drawings.

DETAILED DESCRIPTION

Figure 1:
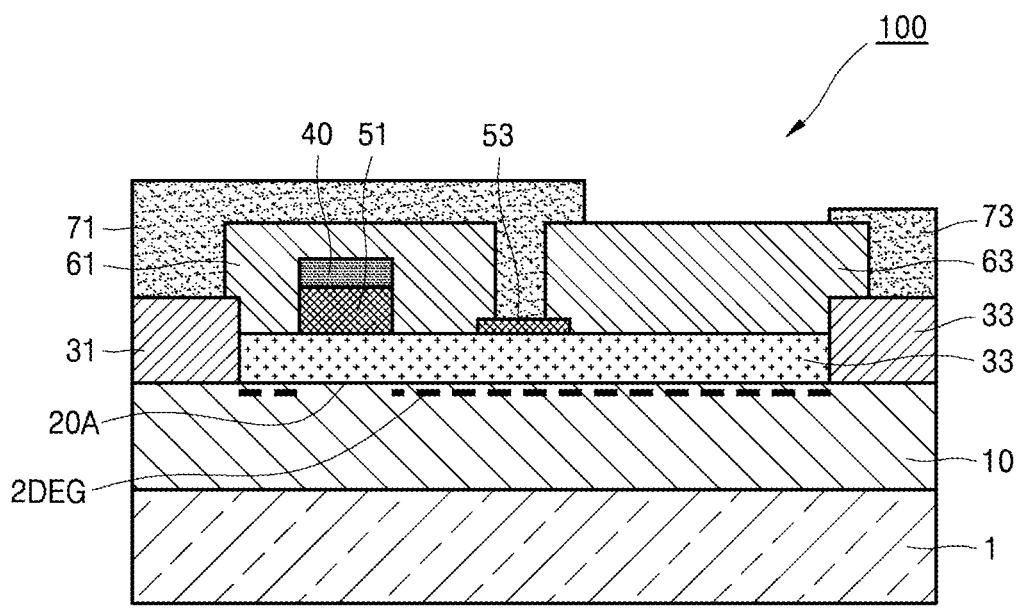
FIG. 1 is a cross-sectional view of a high electron mobility transistor (HEMT) according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
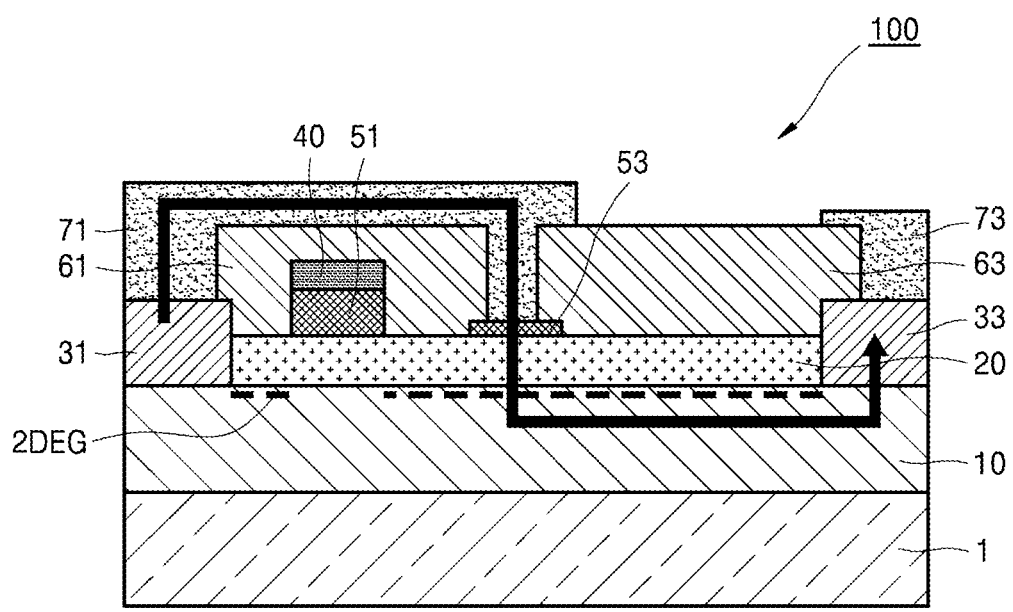
FIG. 2 is a cross-sectional view of the HEMT of FIG. 1, for describing a flow of a reverse current in an off state.

FIG. 1 is a cross-sectional view of a high electron mobility transistor (HEMT) 100 according to example embodiments. FIG. 2 is a cross-sectional view of the HEMT 100 of FIG. 1 for describing a flow of a reverse current in an off state.

Referring to FIG. 1, the HEMT 100 may include a substrate 1, a channel layer 10, a channel supply layer 20, a source electrode 31, a drain electrode 33, first and second depletion-forming layers 51 and 53, and a gate electrode 40.

The substrate 1 may include, for example, sapphire, silicon (Si), silicon carbide (SiC), gallium nitride (GaN), or the like. However, these are just examples, and the substrate 1 may include other materials.

The channel layer 10 is formed on the substrate 1. The channel layer 10 forms a channel between the source electrode 31 and the drain electrode 33 and may be a semiconductor layer. For example, the channel layer 10 may include at least one selected the group consisting of various materials, such as GaN, indium gallium nitride (InGaN), aluminum gallium nitride (AlGaN), and the like. However, the channel layer 10 is not limited thereto and may include other materials provided a two-dimensional electron gas (2DEG) may be formed therein. The channel layer 10 may be an undoped layer, but may also be a layer doped with desired (and/or alternatively predetermined) impurities according to circumstances. The thickness of the channel layer 10 may be tens of nm or less. For example, the thickness of the channel layer 10 may be about 10 nm or less.

The channel supply layer 20 may be provided on the channel layer 10. The channel supply layer 20 may include a material (semiconductor) different from that of the channel layer 10 with respect to at least one selected from the group consisting of a polarization characteristic, an energy bandgap, and a lattice constant. For example, the channel supply layer 20 may include a material (semiconductor) having a higher polarizability and/or a higher energy bandgap than the channel layer 10. For example, the channel supply layer 20 may have a single-layer or a multi-layer structure including one or more nitrides including at least one selected from the group consisting of aluminum (Al), gallium (Ga), indium (In), and boron (B). For example, the channel supply layer 20 may have a single-layer or a multi-layer structure including at least one selected from the group consisting of various materials, such as aluminum gallium nitride (AlGaN), aluminum indium nitride (AlInN), indium gallium nitride (InGaN), aluminum nitride (AlN), aluminum indium gallium nitride (AlInGaN), and the like. The channel supply layer 20 may be an undoped layer but may be a layer doped with desired (and/or alternatively predetermined) impurities in accordance with circumstances. The thickness of the channel supply layer 20 may be tens of nm or less. For example, the thickness of the channel supply layer 20 may be about 30 nm or less.

A 2DEG may be formed in a portion of the channel layer 10 below an interface 20A between the channel layer 10 and the channel supply layer 20.

The 2DEG formed in the channel layer 10 may be used as a current path, e.g., a channel, between the source electrode 31 and the drain electrode 33. The source electrode 31 and the drain electrode 33 may be arranged in various structures in which the 2DEG is used as a channel. For example, as shown in the drawings, a region (31A; see FIG. 6D) in which the source electrode 31 is to be formed and a region (33A; see FIG. 6D) in which the drain electrode 33 is to be formed are formed by etching the channel supply layer 20, and the source electrode 31 and the drain electrode 33 may be formed in the regions 31A and 33A, respectively. As another example, although not shown, the source electrode 31 and the drain electrode 33 may be formed on the channel supply layer 20, in regions obtained by etching a partial thickness of the channel supply layer 20, or in regions obtained by etching a partial thickness of the channel layer 10. The source electrode 31 and the drain electrode 33 may form an ohmic contact with the channel layer 10 or the channel supply layer 20.

The gate electrode 40 controls a current flowing between the source electrode 31 and the drain electrode 33. The source electrode 31 and the drain electrode 33 are separately arranged, and the gate electrode 40 may be arranged between the source electrode 31 and the drain electrode 33.

The gate electrode 40 may have a normally-off structure. The normally-off structure is a structure in which the gate electrode 40 is in an off state when no voltage is applied thereto (e.g., when the gate electrode 40 is in a normal state), and is in an on state when a voltage is applied thereto.

As an example of the normally-off structure, a depletion-forming layer may be disposed between the gate electrode 40 and the channel supply layer 20. According to example embodiments, as described below, the depletion-forming layer may include the first and second depletion-forming layers 51 and 53, and the gate electrode 40 is formed on the first depletion-forming layer 51. The first and second depletion-forming layers 51 and 53 may form a depletion region in the 2DEG formed in the channel layer 10. An energy bandgap of corresponding parts of the channel supply layer 20 below the first and second depletion-forming layers 51 and 53 may increase due to the first and second depletion-forming layers 51 and 53. As a result, the depletion region may be formed in the 2DEG formed in the channel layer 10, the depletion region corresponding to the first and second depletion-forming layers 51 and 53. Thus, the 2DEG may be not formed in the depletion region corresponding to the first and second depletion-forming layers 51 and 53, or the region corresponding to the first and second depletion-forming layers 51 and 53 may have characteristics (electron density and the like) other than the other region. The region in which the 2DEG is cut off may be called a 'cut-off region', and the HEMT 100 may have a normally-off characteristic due to the cut-off region.

Each of the first and second depletion-forming layers 51 and 53 may be a p-type semiconductor layer or a semiconductor layer doped with p-type impurities. In addition, each of the first and second depletion-forming layers 51 and 53 may include a III-V group nitride semiconductor. For example, each of the first and second depletion-forming layers 51 and 53 may include at least one selected from the group consisting of gallium nitride (GaN), aluminum gallium nitride (AlGaN), indium nitride (InN), aluminum indium nitride (AlInN), indium gallium nitride (InGaN), and aluminum indium gallium nitride (AlInGaN) and may be doped with p-type impurities such as magnesium (Mg). For example, each of the first and second depletion-forming layers 51 and 53 may be a p-GaN layer or a p-AlGaN layer. Due to the first and second depletion-forming layers 51 and 53, an energy bandgap of the corresponding parts of the channel supply layer 20 therebelow may increase, thereby forming the cut-off region of the 2DEG.

The gate electrode 40 is formed on the first depletion-forming layer 51. The first depletion-forming layer 51 has a first thickness, and the 2DEG is not formed in a region corresponding to the first depletion-forming layer 51. For example, the first depletion-forming layer 51 may have a thickness in the range of 0 to 200 nm, where the thickness is at least greater than 0 nm, but example embodiments are not limited thereto. The second depletion-forming layer 53 is formed between the gate electrode 40 and the drain electrode 33. The second depletion-forming layer 53 is formed to have a second thickness smaller than the first thickness, and the 2DEG is maintained in a region corresponding to the second depletion-forming layer 53 without being cut off. That is, the second thickness is within a desired (and/or alternatively predetermined) range in order to maintain the 2DEG below the second depletion-forming layer 53 by more than a certain amount. For example, the second thickness may be within a range between about 20% and about 30% of the first thickness. As another example, the second thickness may be determined so that a density of the 2DEG formed below the second depletion-forming layer 53 is about 90% of a density of the 2DEG formed in an adjacent region.

The second depletion-forming layer 53 may be electrically connected to the source electrode 31. To this end, a first pad 71 connected to the source electrode 31 may be formed to extend to the second depletion-forming layer 53. The second depletion-forming layer 53 electrically connected to the source electrode 31 may operate as an anode electrode, and the drain electrode 33 may operate as a cathode electrode. Accordingly, the HEMT 100 may also function as a free wheeling diode.

Referring to FIG. 2, the source electrode 31 is electrically connected to the second depletion-forming layer 53 through the first pad 71. The second depletion-forming layer 53, which operates as an anode electrode, and the drain electrode 33, which operates as a cathode electrode, are connected to each other through the 2DEG formed below therebelow. Thus, a reverse current of the HEMT 100 in the off state may flow in an arrow direction as shown in FIG. 2. Accordingly, the HEMT 100 may function as a free wheeling diode, and thus, no free wheeling diode has to be additionally manufactured.

Referring back to FIG. 1, the first pad 71 contacts the source electrode 31 and the second depletion-forming layer 53, and the same bias voltage may be applied to the source electrode 31 and the second depletion-forming layer 53 through the first pad 71. A second pad 73 may contact the drain electrode 33.

Passivation layers 61 and 63 may be formed between the source electrode 31 and the second depletion-forming layer 53 and between the second depletion-forming layer 53 and the drain electrode 33, respectively. The passivation layer 61 formed between the source electrode 31 and the second depletion-forming layer 53 functions to protect the gate electrode 40 and simultaneously functions to limit (and/or block) the gate electrode 40 from an electrical contact with the source electrode 31, the second depletion-forming layer 53, and the first pad 71. In addition, the passivation layer 63 formed between the second depletion-forming layer 53 and the drain electrode 33 may insulate the second depletion-forming layer 53 from the drain electrode 33 and the second pad 73.

Figure 3:
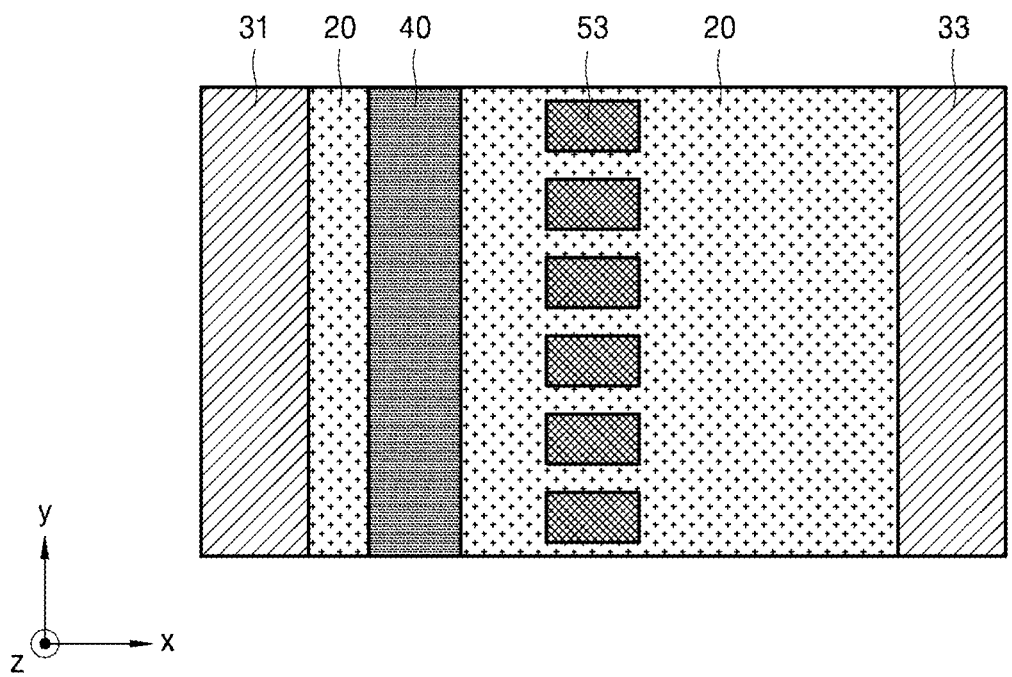
FIG. 3 is a top view of the HEMT of FIG. 1, according to example embodiments.

FIG. 3 is a top view of the HEMT 100 of FIG. 1, according to example embodiments. A structure of the second depletion-forming layer 53 will now be described with reference to FIG. 3. In FIG. 3, the passivation layers 61 and 63 and the first and second pads 71 and 73 of FIG. 1 are not shown for convenience of description.

Referring to FIG. 3, the second depletion-forming layer 53 may be formed in a constant pattern along a width direction (y-axis direction) of the channel supply layer 20. For example, a plurality of second depletion-forming layers 53 may be formed, and the plurality of second depletion-forming layers 53 may be arranged along the width direction (y-axis direction) of the channel supply layer 20 with a constant gap. That is, the second depletion-forming layer 53 may have a stripe-shaped pattern arranged in parallel with the width direction (y-axis direction) of the channel supply layer 20. With the stripe-shaped pattern, a turn-on voltage may decrease due to a region in which the second depletion-forming layer 53 is formed in a forward operation of the HEMT 100, and a reverse leakage current may also be reduced due to a region except for the second depletion-forming layer 53 in a reverse operation of the HEMT 100. The width direction (y-axis direction) of the channel supply layer 20 indicates a direction perpendicular to a length direction (x-axis direction) of the channel layer 10 in which a channel is formed between the source electrode 31 and the drain electrode 33.

Figure 4:
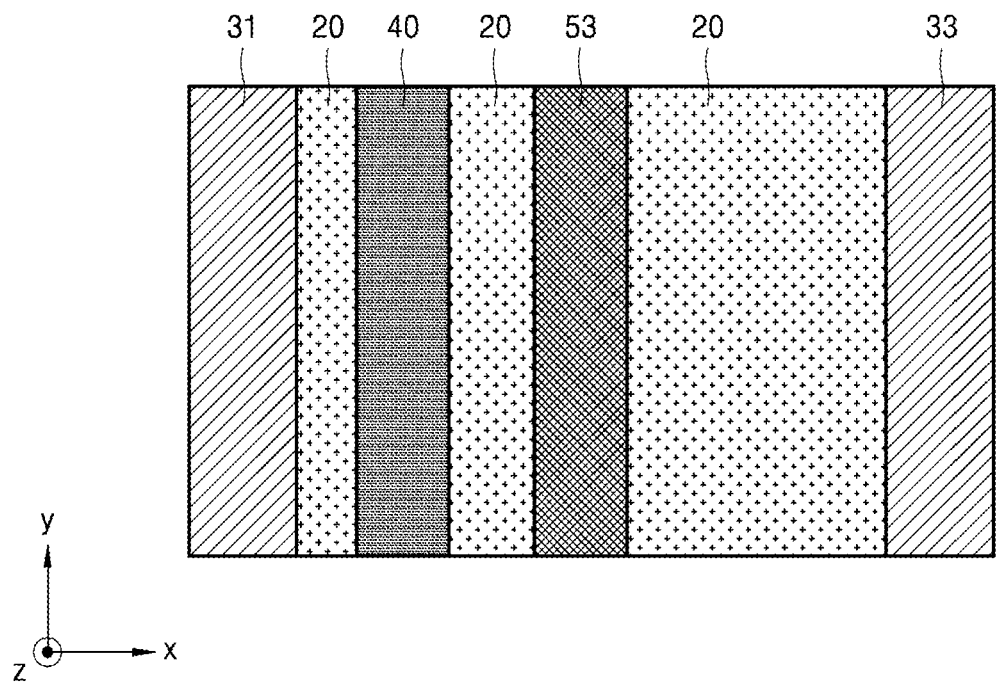
FIG. 4 is a top view of an HEMT according to example embodiments.

However, an arrangement shape of the second depletion-forming layer 53 is not limited thereto. For example, as shown in FIG. 4, the second depletion-forming layer 53 may be continuously formed along the width direction (y-axis direction) of the channel layer 10 without any pattern.

Figure 5:
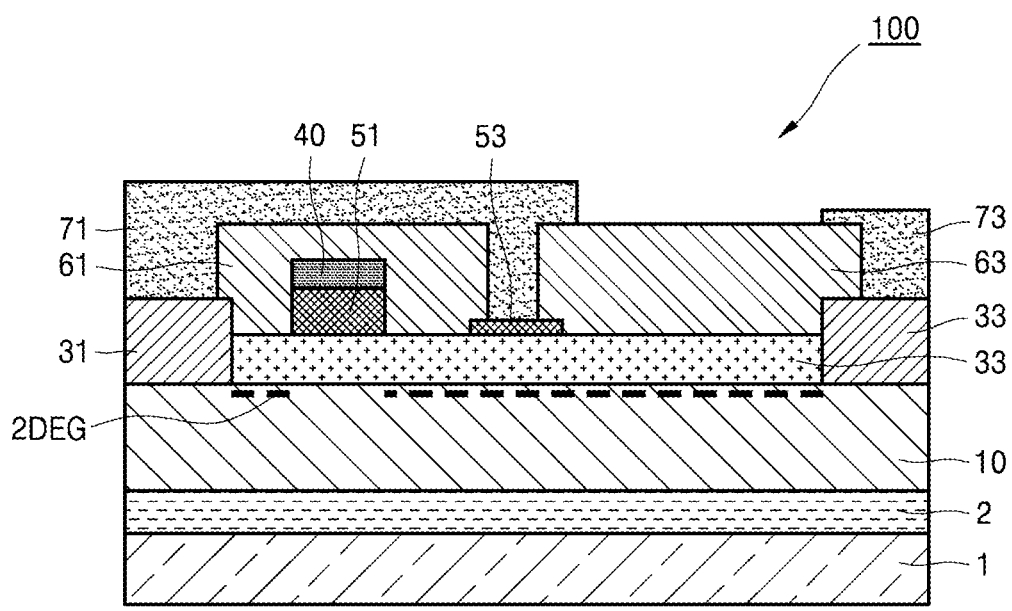
FIG. 5 is a cross-sectional view of an HEMT further including a buffer layer in comparison to the HEMT of FIG. 1, according to example embodiments.

FIG. 5 is a cross-sectional view of an HEMT 100 further including a buffer layer 2 in addition to the HEMT 100 of FIG. 1, according to example embodiments. Referring to FIG. 5, the buffer layer 2 may be provided on the substrate 1. The substrate 1 may include, for example, sapphire, silicon (Si), silicon carbide (SiC), gallium nitride (GaN), or the like. The buffer layer 2 may be provided to limit (and/or prevent) a decrease in crystallinity of the channel layer 10 by alleviating a lattice constant difference and a thermal expansion coefficient difference between the substrate 1 and the channel layer 10. The buffer layer 2 may have a single-layer or a multi-layer structure including one or more nitrides including at least one selected from the group consisting of aluminum (Al), gallium (Ga), indium (In), and boron (B). For example, the buffer layer 2 may have a single-layer or a multi-layer structure including at least one selected from the group consisting of various materials, such as aluminum nitride (AlN), gallium nitride (GaN), aluminum gallium nitride (AlGaN), indium gallium nitride (InGaN), aluminum indium nitride (AlInN), aluminum gallium indium nitride (AlGaInN), and the like. In accordance with circumstances, a desired (and/or alternatively predetermined) seed layer may be further provided between the substrate 1 and the buffer layer 2. The seed layer may be a base layer for growing the buffer layer 2. The substrate 1 and the buffer layer 2 may be removed after the HEMT 100 is manufactured. In other words, the HEMT 100 may optionally include the substrate 1 and the buffer layer 2.

FIGS. 6A to 6F are cross-sectional views for describing a method of manufacturing the HEMT 100 of FIG. 1, according to example embodiments. Like members described above are denoted by like reference numerals.

Figure 6A:
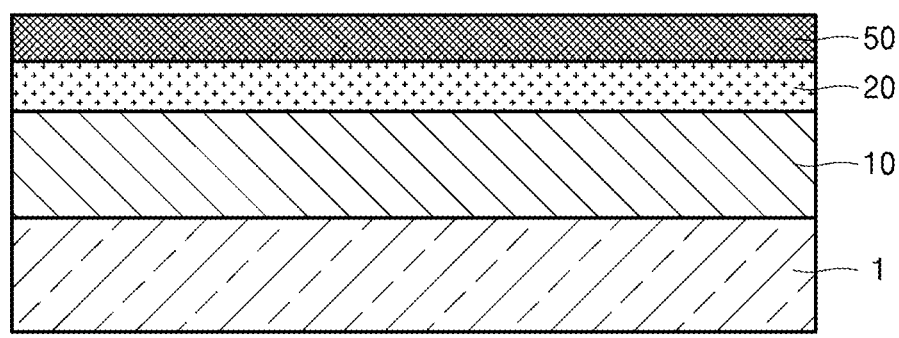
FIGS. 6A to 6F are cross-sectional views for describing a method of manufacturing the HEMT of FIG. 1, according to example embodiments.

Referring to FIG. 6A, the channel layer 10 may be formed on the substrate 1, and the channel supply layer 20 may be formed on the channel layer 10. A depletion-forming layer 50 may be formed on the channel supply layer 20. A thickness of the depletion-forming layer 50 may be in the range of 0 to 200 nm, where the thickness is greater than 0 nm, but example embodiments are not limited thereto.

The channel layer 10 may be formed of a III-V group compound semiconductor, e.g., GaN. The channel supply layer 20 may be formed of a semiconductor other than the channel layer 10. An epitaxial growth may be used to form the channel supply layer 20 on the channel layer 10. The channel supply layer 20 may be formed of a material (semiconductor) that is different from the channel layer 10 with respect to at least one of a polarization characteristic, an energy bandgap, and a lattice constant. For example, the channel supply layer 20 may be formed of a material (semiconductor) having a higher polarizability and/or a higher energy bandgap than the channel layer 10. For example, the channel supply layer 20 may have a single-layer or a multi-layer structure including one or more nitrides including at least one selected from the group consisting of aluminum (Al), gallium (Ga), indium (In), and boron (B). For example, the channel supply layer 20 may have a single-layer or a multi-layer structure including at least one selected from the group consisting of various materials, such as aluminum gallium nitride (AlGaN), aluminum indium nitride (AlInN), indium gallium nitride (InGaN), aluminum nitride (AlN), aluminum indium gallium nitride (AlInGaN), and the like. The channel supply layer 20 may be an undoped layer but may be a layer doped with desired (and/or alternatively predetermined) impurities in accordance with circumstances.

Figure 6B:
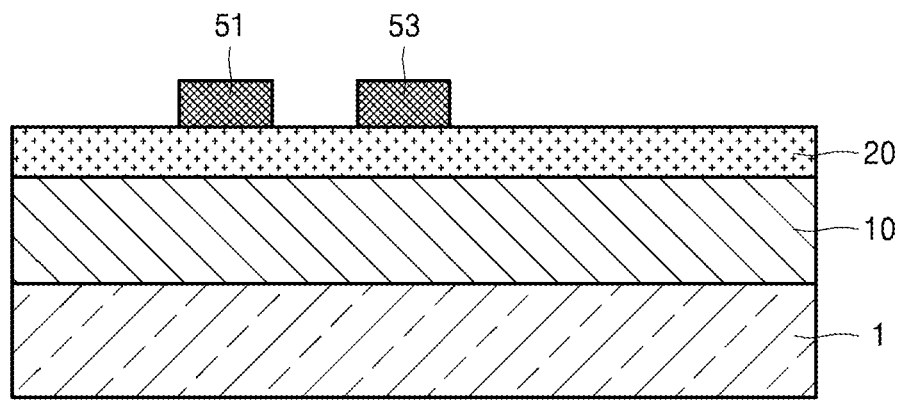

Referring to FIG. 6B, the first and second depletion-forming layers 51 and 53 are formed by etching the depletion-forming layer 50. For example, a mask (not shown) limiting a region in which the first and second depletion-forming layers 51 and 53 are to be formed may be arranged on the depletion-forming layer 50. Thereafter, the first and second depletion-forming layers 51 and 53 may be formed by etching the depletion-forming layer 50 by using the mask and removing the mask. When the first and second depletion-forming layers 51 and 53 are formed on partial regions of the channel supply layer 20, a density of the 2DEG below the first and second depletion-forming layers 51 and 53 is lowered, or the 2DEG below the first and second depletion-forming layers 51 and 53 is cut off. That is, regions below the first and second depletion-forming layers 51 and 53 are depletion regions. In example embodiments, the 2DEG is cut off in the region below the first depletion-forming layer 51, and as described below, the 2DEG is maintained in the region below the second depletion-forming layer 53 without being cut off.

Figure 6C:
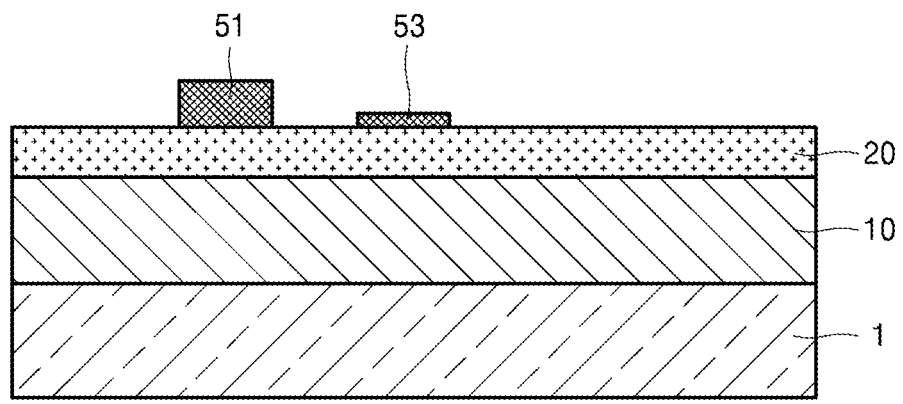

Referring to FIG. 6C, the second depletion-forming layer 53 is additionally etched. That is, the second depletion-forming layer 53 is etched to have a thickness smaller than that of the first depletion-forming layer 51. As such, by additionally etching the second depletion-forming layer 53, the 2DEG is maintained in the region below the second depletion-forming layer 53 without being cut off.

Figure 6D:
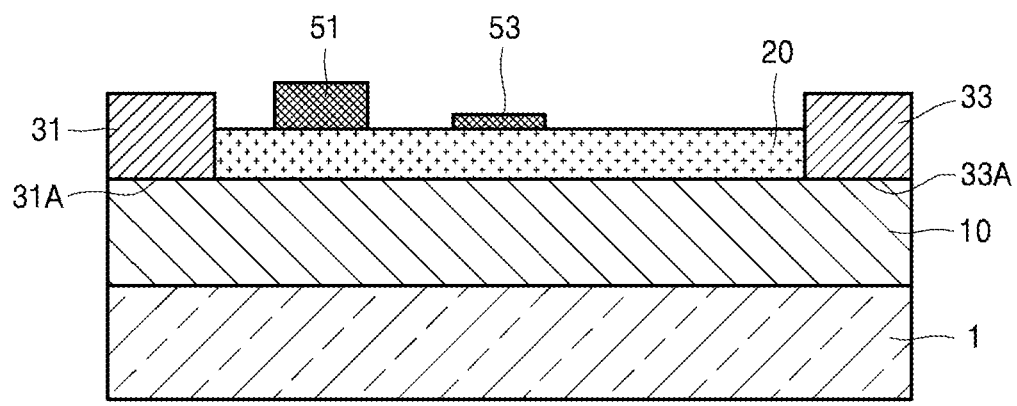

Referring to FIG. 6D, both sides of the channel supply layer 20 are etched up to a desired (and/or alternatively predetermined) depth in order to form regions 31A and 33A in which the source electrode 31 and the drain electrode 33 are to be formed. For example, the region 31A in which the source electrode 31 is to be formed and the region 33A in which the drain electrode 33 is to be formed may be etched until the channel layer 10 is exposed. However, an etching depth is not limited thereto and may be increased or decreased in accordance with circumstances.

The source electrode 31 and the drain electrode 33 may be formed in the regions 31A and 33A in which the source electrode 31 and the drain electrode 33 are to be formed. In example embodiments, to form the regions 31A and 33A in which the source electrode 31 and the drain electrode 33 are to be formed, the channel supply layer 20 is etched until the channel layer 10 is exposed. However, this is only illustrative, and, the source electrode 31 and the drain electrode 33 may be formed after only a partial thickness of the channel supply layer 20 is etched. As another example, the etching may be performed up to a portion of the channel layer 10 to form the source electrode 31 and the drain electrode 33 in corresponding regions.

Figure 6E:
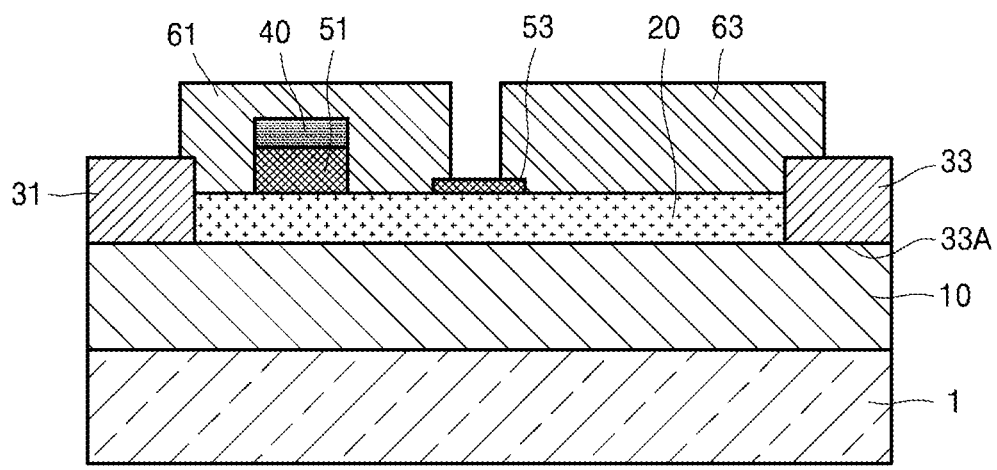

Referring to FIG. 6E, the gate layer 40 is formed on the first depletion-forming layer 51. The passivation layers 61 and 63 may be formed between the source electrode 31 and the second depletion-forming layer 53 and between the second depletion-forming layer 53 and the drain electrode 33, respectively. The passivation layer 61 formed between the source electrode 31 and the second depletion-forming layer 53 may insulate the gate electrode 40 from the source electrode 31, the second depletion-forming layer 53, and the first pad 71. In addition, the passivation layer 63 formed between the second depletion-forming layer 53 and the drain electrode 33 may insulate the second depletion-forming layer 53 from the drain electrode 33 and the second pad 73.

Figure 6F:
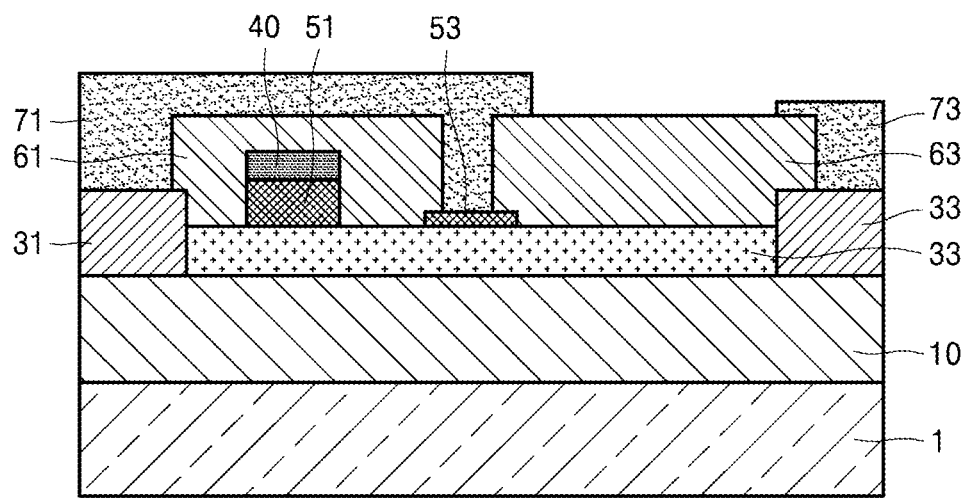

Referring to FIG. 6F, the first pad 71 and the second pad 73 may be formed. The first pad 71 contacts the source electrode 31 and the second depletion-forming layer 53, and the second pad 73 contacts the first pad 71 and the drain electrode 33. The first pad 71 may be formed over the source electrode 31, the passivation layer 61, and the second depletion-forming layer 53 to commonly contact the source electrode 31 and the second depletion-forming layer 53.

The manufacturing method of FIGS. 6A to 6F may be variously modified.

The second depletion-forming layer 53 may be formed in a constant pattern along the width direction (y-axis direction) of the channel supply layer 20. For example, a plurality of second depletion-forming layers 53 may be formed, and the plurality of second depletion-forming layers 53 may be arranged along the width direction (y-axis direction) of the channel layer 10 with a constant gap therebetween.

The arrangement shape of the second depletion-forming layer 53 is not limited thereto. For example, as shown in FIG. 4, the second depletion-forming layer 53 may be continuously formed along the width direction (y-axis direction) of the channel layer 10 without any pattern.

The HEMT 100 may be used as, for example, a power device. However, the HEMT 100 may be used as other devices too.

As described above, according to example embodiments, an HEMT capable of passing a reverse current even in an off state and simultaneously decreasing power consumption by functioning both as a field effect semiconductor device and a free wheel diode may be provided.

While some example embodiments have been particularly shown and described, it will be understood by one of ordinary skill in the art that variations in form and detail may be made therein without departing from the spirit and scope of the claims. The structure of the HEMT 100 shown in the drawings may be variously modified. For example, one of ordinary skill in the art would appreciate that a material other than a GaN group material may be used as a material of the channel layer 10 and the channel supply layer 20. In addition, positions of the channel layer 10 and the channel supply layer 20 may be exchanged. In addition, it will be understood that the manufacturing method of FIGS. 6A to 6F may be variously modified. Further, it will be understood by one of ordinary skill in the art that inventive concepts described herein may be applicable to semiconductor devices other than an HEMT. Therefore, while some example embodiments have been particularly shown and described, it will be understood by one of ordinary skill in the art that variations in form and detail may be made therein without departing from the spirit and scope of the claims.

What is claimed is:

1. A high electron mobility transistor (HEMT) comprising:
   a channel layer;
   a channel supply layer on the channel layer;
   a source electrode and a drain electrode spaced apart from each other on one of the channel layer and the channel supply layer;
   a gate electrode on a part of the channel supply layer between the source electrode and the drain electrode;
   a first depletion-forming layer between the gate electrode and the channel supply layer; and
   at least one second depletion-forming layer on the channel supply layer between the gate electrode and the drain electrode,
   the at least one second depletion-forming layer being electrically connected to the source electrode, wherein a thickness of the at least one second depletion-forming layer is less than a thickness of the first depletion-forming layer.

2. The HEMT of claim 1, wherein the thickness of the at least one second depletion-forming layer is about 20% to about 30% of the thickness of the first depletion-forming layer.

3. The HEMT of claim 1, wherein
the channel layer includes a two-dimensional electron gas (2DEG), and
a density of the two-dimensional electron gas (2DEG) below the at least one second depletion-forming layer is about 90% of a density of a 2DEG in an adjacent region of the channel layer.

4. The HEMT of claim 1, wherein
the at least one second depletion-forming layer includes a plurality of second depletion-forming layers on the channel supply layer, and
the plurality of second depletion-forming layers are spaced apart from each other along a width direction of a channel in the channel layer.

5. The HEMT of claim 4, wherein the plurality of second depletion-forming layers has a stripe pattern that is parallel to the width direction of the channel in the channel layer.

6. The HEMT of claim 1, wherein the at least one second depletion-forming layer is one continuous second depletion-forming layer that extends along a width direction of a channel in the channel layer.

7. The HEMT of claim 1, wherein the at least one second depletion-forming layer is a plurality of second depletion-forming layers spaced apart from each other along a width direction of a channel in the channel layer.

8. The HEMT of claim 1, wherein each of the first and the at least one second depletion-forming layers is a p-type semiconductor layer.

9. The HEMT of claim 1, further comprising:
a first pad contacting the source electrode and the at least one second depletion-forming layer; and
a second pad contacting the drain electrode.

10. The HEMT of claim 9, further comprising:
a passivation layer is between the gate electrode and the first pad.

11. A method of manufacturing a high electron mobility transistor (HEMT), comprising:
forming a channel layer;
forming a channel supply layer on the channel layer;
forming a first depletion-forming layer and at least one second depletion-forming layer on the channel supply layer, a thickness of the at least one second depletion-forming layer being less than a thickness of the first depletion-forming layer;
forming a source electrode and a drain electrode spaced apart from each other on one of the channel layer and the channel supply layer, the at least second depletion-forming layer being electrically connected to the source electrode; and
forming a gate electrode on the first depletion-forming layer and a part of the channel supply layer between the source electrode and the drain electrode, such that the first depletion-forming layer is between the gate electrode and the channel supply layer, the at least one second depletion-forming layer being on the channel supply layer between the gate electrode and the drain electrode.

12. The method of claim 11, wherein
the at least one second depletion-forming layer is between the first depletion-forming layer and the drain electrode.

13. The method of claim 12, wherein the forming the at least one second depletion-forming layer includes forming a plurality of second depletion-forming layers on the channel supply layer that are spaced apart from each other along a width direction of a channel in the channel layer.

14. The method of claim 12, wherein the forming the at least one second-depletion forming layer includes forming one continuous second depletion-forming layer that extends along a width direction of a channel in the channel layer.

15. The method of claim 11, further comprising:
forming a first pad contacting the source electrode and the at least one second depletion-forming layer; and
forming a second pad contacting the drain electrode.

16. The method of claim 15, further comprising:
forming a passivation layer on the channel supply layer between the gate electrode and the first pad.

* * * * *